United States Patent
Myers et al.

(10) Patent No.: US 9,368,676 B2
(45) Date of Patent: Jun. 14, 2016

(54) GD DOPED ALGAN ULTRAVIOLET LIGHT EMITTING DIODE

(71) Applicants: Roberto C. Myers, Columbus, OH (US); Thomas F. Kent, Columbus, OH (US)

(72) Inventors: Roberto C. Myers, Columbus, OH (US); Thomas F. Kent, Columbus, OH (US)

(73) Assignee: OHIO STATE INNOVATION FOUNDATION, Columbus, OH (US)

( * ) Notice: Subject to any disclaimer, the term of this patent is extended or adjusted under 35 U.S.C. 154(b) by 0 days.

(21) Appl. No.: 14/463,142

(22) Filed: Aug. 19, 2014

(65) Prior Publication Data

US 2015/0048306 A1      Feb. 19, 2015

Related U.S. Application Data

(60) Provisional application No. 61/959,262, filed on Aug. 19, 2013.

(51) Int. Cl.
*H01L 33/26* (2010.01)
*H01L 33/06* (2010.01)
(Continued)

(52) U.S. Cl.
CPC ............... *H01L 33/06* (2013.01); *H01L 33/32* (2013.01); *H01L 33/18* (2013.01)

(58) Field of Classification Search
CPC ....... H01L 33/002; H01L 33/06; H01L 33/24; H01L 33/26
See application file for complete search history.

(56) References Cited

U.S. PATENT DOCUMENTS

| | | | | |
|---|---|---|---|---|
| 2012/0273754 A1* | 11/2012 | Wei | ............... | H01L 33/40 257/13 |
| 2012/0273818 A1* | 11/2012 | Wei | ............... | H01L 21/0237 257/98 |

(Continued)

OTHER PUBLICATIONS

Ultraviolet light emitting devices using AlGdN (2011).*

(Continued)

*Primary Examiner* — Bilkis Jahan
(74) *Attorney, Agent, or Firm* — Fay Sharpe LLP

(57) ABSTRACT

A diode comprises nanowires compositionally graded along their lengths with an active region doped with gadolinium sandwiched between first and second compositionally graded $Al_xGa_{1-x}N$ nanowire regions. The first graded $Al_xGa_{1-x}N$ nanowire region is graded from gallium-rich to aluminum-rich with the compositional grading defining n-type polarization doping and the aluminum-rich end proximate the active region. The second graded $Al_xGa_{1-x}N$ nanowire region is graded from aluminum-rich to gallium-rich with the compositional grading defining p-type polarization doping and with the aluminum rich end proximate the active region. The active region may include a GdN layer sandwiched between AlN layers, or an $Al_{1-y}Gd_yN$ layer with $y \geq 0.5$. The nanowires may be disposed on a silicon substrate having a GaN surface, with the gallium-rich end of the first graded $Al_xGa_{1-x}N$ nanowire region proximate to the GaN surface, and a semitransparent electrical contact disposed on the gallium-rich end of the second graded $Al_xGa_{1-x}N$ nanowire region.

19 Claims, 7 Drawing Sheets

(51) Int. Cl.
*H01L 33/32* (2010.01)
*H01L 33/18* (2010.01)

(56) References Cited

U.S. PATENT DOCUMENTS

2013/0207075 A1   8/2013   Meyers et al.
2013/0240348 A1*  9/2013   Mi et al. .................. 204/157.5

OTHER PUBLICATIONS

Kent, et al., "Atomically sharp 318 nm Gd: AlGaN ultraviolet light emitting diodes on Si with low threshold voltage," Applied Physics Letters, vol. 102, pp. 201114-1 to 201114-4 (May 2013).

Kita, et al., "Narrow-band deep-ultraviolet light emitting device using $Al_{1-x}Gd_xN$," Applied Physics Letters, vol. 93, pp. 211901-1 to 211901-3 (Nov. 2008).

Zavada, et al., "Ultraviolet photoluminescence from Gd-implanted AlN epilayers," Applied Physics Letters, vol. 89, pp. 152107-1 to 152107-3 (Oct. 10, 2006).

Kitayama, et al., "Influence of local atomic configuration in AlGdN phosphor thin films on deep ultra-violet luminescence intensity," Journal of Applied Physics, vol. 110, pp. 093108-1 to 093108-4 (Nov. 2011).

Nyein, et al., "Spectral and time-resolved photoluminescence studies of Eu-doped GaN," Applied Physics Letters, vol. 82, No. 11, pp. 1655-1657 (Jan. 2003).

Vetter, et al., "Intense ultraviolet cathodoluminescence at 318 nm for $Gd^{3+}$-doped AlN," Applied Physics Letters, vol. 83, No. 11, pp. 2145-2147 (Jun. 2003).

Jena, et al., "Realization of wide electron slabs by polarization bulk doping in graded III-V nitride semiconductor alloys," Applied Physics Letters, vol. 81, No. 23, pp. 4395-4397 (2002).

Koblmüller, et al., "In situ investigation of growth modes during plasma-assisted molecular bean epitaxy of (0001) GaN," Applied Physics Letters, vol. 91, pp. 161904-1-161904-3 (2007).

Chevtchenko, et al., "Surface band bending of a—plane GaN studied by scanning Kelvin probe microscopy," Applied Physics Letters, vol. 88, pp. 122104-1-122104-3 (2006).

Kuykendall, et al., "Complete composition tenability of InGaN nanowires using a combinatorial approach," Nature Materials, vol. 6, pp. 951-956 (2007).

Ristić, et al., "On the mechanisms of spontaneous growth of III-nitride nanocolumns by plasma-assisted molecular beam epitaxy," Journal of Crystal Growth, vol. 310, pp. 4035-4045 (2008).

Ambacher, et al., "Two-dimensional electron gases induced by spontaneous and piezoelectric polarization charges in N- and Ga-face AlGaN/GaN heterostructures," Journal of Applied Physics, vol. 85, pp. 3222-3233 (1999).

Kusakabe, et al., "Characterization of Overgrown GaN Layers on Nano-Columns Grown by RF-Molecular Beam Epitaxy," Japan Journal of Applied Physics, vol. 40, pp. L192-L194 (2001).

Simon, et al., "Polarization-Induced Hole Doping in Wide-Band-Gap Uniaxial Semiconductor Heterostructures," Science magazine, vol. 327, pp. 60-64 (2010).

Calleja, et al., "Luminescence properties and defects in GaN nanocolumns grown by molecular beam epitaxy," The American Physical Society, Physical Review B, vol. 62, No. 24, pp. 16826-16834 (2000).

Stocia, et al., Photoluminescence and Intrinsic Properties of MBE-Grown InN Nanowires, Nano Letters, vol. 6, No. 7, pp. 1541-1547 (2006).

Bertness, et al., "Mechanism for Spontaneous Growth of GaN nanowires with molecular beam epitaxy," Journal of Crystal Growth, vol. 310, pp. 3154-3158 (2008).

Yoshizawa, et al., "Growth of Self-Organized GaN Nanostructures on $Al_2O_3$ (0001) by RF-Radical Source Molecular Beam Epitaxy," Japan Journal of Applied Physics, vol. 36, pp. L459-L462 (1997).

Heying, et al., "Control of GaN surface morphologies using plasma-assisted molecular beam epitaxy," Journal of Applied Physics, vol. 88, No. 4, pp. 1855-1860 (2000).

Bertness, et al., Spontaneously grown GaN and AlGaN nanowires, Journal of Crystal Growth, vol. 287, pp. 522-527 (2006).

\* cited by examiner

GD DOPED ALGAN ULTRAVIOLET LIGHT EMITTING DIODE

This application claims the benefit of U.S. Provisional Application No. 61/959,262 filed Aug. 19, 2013 and titled "GD DOPED ALGAN ULTRAVIOLET LIGHT EMITTING DIODE". U.S. Provisional Application No. 61/959,262 filed Aug. 19, 2013 and titled "GD DOPED ALGAN ULTRAVIOLET LIGHT EMITTING DIODE" is hereby incorporated by reference in its entirety into the specification of this application This invention was made with Government support under grant/contract no. NSF DMR-0820414 awarded by the National Science Foundation (NSF) and National Science Foundation CAREER award (DMR-1055164). The Government has certain rights in this invention.

BACKGROUND

The following relates to ultraviolet (UV) light emitting diodes (LED's), UV lasers, and related technologies.

Many materials have been developed as hosts for elements with optically active energetic transitions to produce lasers and electroluminescent devices with emission in the visible and infrared (IR) part of the electromagnetic spectrum. These include electrically driven devices utilizing rare earth (RE) phosphors in wide or medium gap semiconductors, such as thin film electroluminescent devices (TFED) with RE phosphors which have found applications as visible and IR emitters.

Optoelectronic devices which utilize atomic transitions in the rare earths for electroluminescence (EL) can offer a number of advantages over EL produced from band-to-band recombination. First, the transition energy is dictated by the energy level scheme of the 4f orbital, which is relatively unperturbed by the crystalline environment due to the fact that the 5d and 5s,5p orbitals extend to further radial distances, and fill before the f shell of lower principal quantum number. This shielding by the earlier filled 5d and 5s orbitals causes the energies of the 4f transitions to be relatively insensitive to crystalline imperfections, unlike transitions based on band-to-band transitions in semiconductors. Band-to-band optical transitions are sensitive to deep levels, exciton-phonon interaction, and crystalline disorder which can lead to broadening of emission or parasitic emission at an unintended energy. Additionally, due to the decoupling of the 4f orbital with the lattice, emission from rare earth centers is spectrally pure with common full width at half maximum (FWHM) of less than 30 meV.

The spectrally narrow and energetically stable nature of the $Gd^{3+}$ fluorescence emission make it a potential candidate for spectroscopic and lithographic applications in the UV. This has led to exploration of dilutely Gd-doped $Al_xGa_{1-x}N$ in the form of fluorescence and cathodoluminescence experiments. Although the 4f levels in the $RE^{3+}$ are typically thought not to interact with the surrounding lattice, cathodoluminescence data for Gd:AlN thin films show phonon replica satellite peaks of the $Gd^{3+}$ $^6P_{7/2} \rightarrow {}^8S_{7/2}$ (318 nm) transitions. Vetter et al., Appl. Phys. Lett. 83, 2145 (2003). These data suggest that the 4f electrons in $Gd^{3+}$ in AlN are not completely decoupled from the host lattice. Other Gd:AlGaN compounds spectroscopy are reported in: Kita et al., Appl. Phys. Lett. 93, 21190 (2008); Zavada et al., Appl. Phys. Lett. 89, 152107 (2006); Gruber et al., Phys. Rev. B 69, 195202 (2004).

Less work has focused on development of active optoelectronic devices that utilize $Gd^{3+}$ 4f transitions. One difficulty is achieving electrical contact to unintentionally doped (uid) AlN. In one approach (see Kita et al., Appl. Phys. Lett. 93, 21190 (2008); Kitayama et al., J. Appl. Phys. 110, 093108 (2011)), a field emission device consists of a reactive ion sputtered $Al_xGd_{1-x}N$ film with metal contacts, forming a metal-insulator-semiconductor (MIS) structure whereby a high voltage on the order of 270 volts to greater than 1000 volts driven across the device produces fluorescence of the $Gd^{3+}$ ions, likely by the process of impact excitation.

BRIEF SUMMARY

In some embodiments disclosed herein as illustrative examples, a diode comprises nanowires that are compositionally graded along their lengths and that include an active region sandwiched between first and second compositionally graded $Al_xGa_{1-x}N$ nanowire regions, where: the active region is doped with gadolinium; the first compositionally graded $Al_xGa_{1-x}N$ nanowire region is compositionally graded from gallium-rich $Al_xGa_{1-x}N$ to aluminum-rich $Al_xGa_{1-x}N$ with the compositional grading defining n-type polarization doping and with the aluminum rich $Al_xGa_{1-x}N$ to end proximate to the active region; and the second compositionally graded $Al_xGa_{1-x}N$ nanowire region is compositionally graded from aluminum-rich $Al_xGa_{1-x}N$ to gallium-rich $Al_xGa_{1-x}N$ with the compositional grading defining p-type polarization doping and with the aluminum rich $Al_xGa_{1-x}N$ end proximate to the active region. The active region may comprise AlN and gadolinium in the form of one or more GdN layers sandwiched between AlN layers, or in the form of an $Al_{1-y}Gd_yN$ layer with $y \geq 0.5$. The apparatus may further comprise a substrate having a GaN surface on which the first compositionally graded $Al_xGa_{1-x}N$ nanowire region is disposed with its gallium-rich $Al_xGa_{1-x}N$ end proximate to the GaN surface, and a semi-transparent electrical contact disposed on the gallium-rich $Al_xGa_{1-x}N$ end of the second compositionally graded $Al_xGa_{1-x}N$ nanowire region. The substrate may comprise a silicon substrate with a GaN nucleation layer disposed on the silicon substrate. In some more particular embodiments, the first compositionally graded $Al_xGa_{1-x}N$ nanowire region is compositionally graded from GaN to AlN with the AlN end proximate to the active region, the second compositionally graded $Al_xGa_{1-x}N$ nanowire region is compositionally graded from AlN to GaN with the AlN end proximate to the active region, and the active region comprises AlN and gadolinium.

In some embodiments disclosed herein as illustrative examples, an apparatus comprises a polarization-induced nanowire diode comprising aluminum gallium nitride doped with gadolinium. The polarization-induced nanowire diode may comprise a stack including a first region graded from gallium nitride to aluminum nitride, an active region doped with gadolinium, and a second region graded from aluminum nitride to gallium nitride. The active region doped with gadolinium may comprise an aluminum nitride layer doped with gadolinium, or may comprise a gadolinium nitride (GdN) layer disposed between aluminum nitride spacer layers. The first region graded from gallium nitride to aluminum nitride may further include doping of a first type, and the second region graded from aluminum nitride to gallium nitride may further include doping of a second type opposite the first type. A wavelength-selective optical filter may be arranged to pass a gadolinium emission of interest generated by electroluminescence of the nanowire diode while blocking other electroluminescence spectral components of the nanowire diode. The apparatus may further comprise a silicon substrate on which the nanowire diode is disposed, and may further comprise electrodes arranged to electrically energize the nanowire diode.

In some embodiments disclosed herein as illustrative examples, an apparatus comprises a diode comprising aluminum gallium nitride and including an active region comprising a $Al_{1-y}Gd_yN$ layer with y≥0.5 disposed between aluminum nitride spacer layers. The $Al_{1-y}Gd_yN$ layer may comprise a gadolinium nitride (GdN) layer. The diode may further comprise a first region graded from gallium nitride to aluminum nitride and a second region graded from aluminum nitride to gallium nitride, wherein the active region is sandwiched between the first and second regions with the aluminum nitride of each of the first and second regions proximate to the active region.

DETAILED DESCRIPTION

Figure 1:
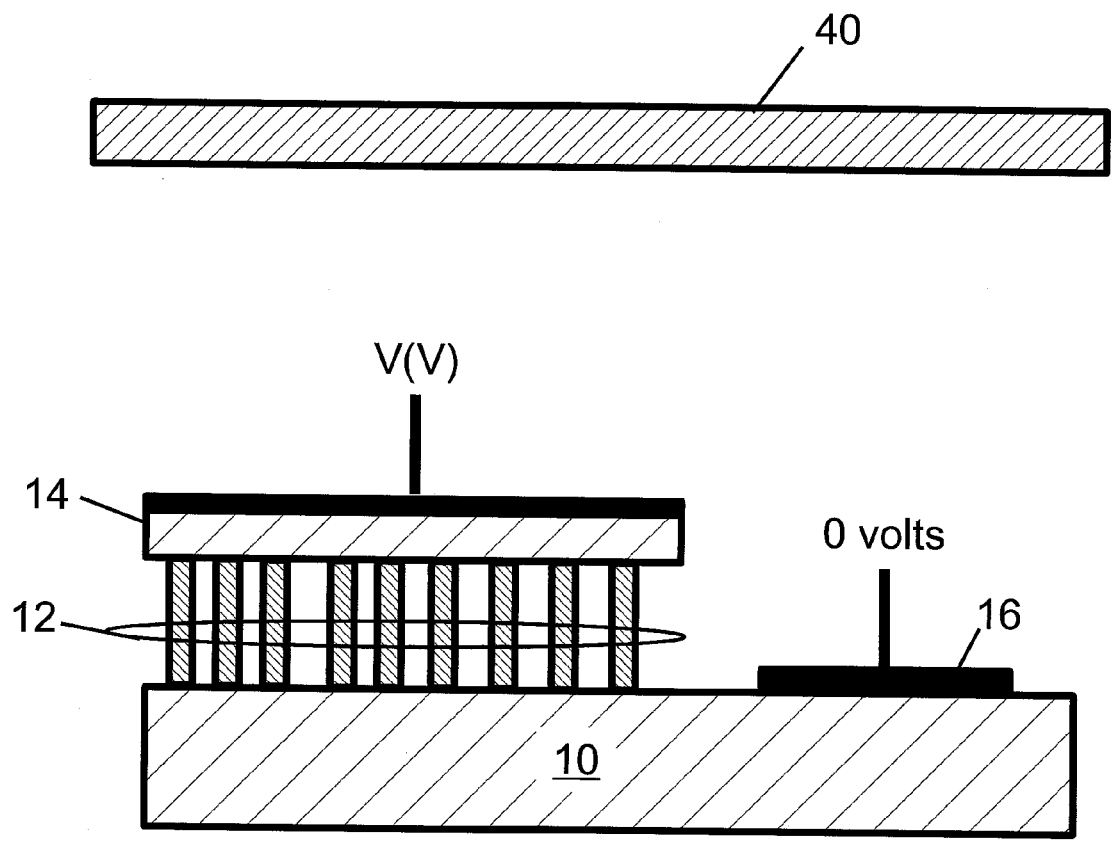
FIG. 1 diagrammatically shows a gadolinium (Gd) doped aluminum gallium nitride (AlGaN) ultraviolet (UV) light emitting diode (LED).

Disclosed herein are methods of electrically stimulating narrow band intra-f-shell fluorescence of gadolinium (Gd) in a wide bandgap semiconductor device in the sub 20V regime. Disclosed approaches include placing a high concentration of Gd atoms in a wide gap aluminum nitride (AlN) active region of a polarization induced light emitting diode epitaxially grown on silicon (Si). As an electrical bias is applied to the n and p contacts, narrow band emission corresponding to Gd intra-f-shell transitions can be observed. A reduction in operating bias of 2-3 orders of magnitude is observed for the disclosed devices as compared with devices operating by impact excitation at similar wavelengths. The devices may, for example, be used as narrow bandwidth UV light sources.

Disclosed low power, narrow band ultraviolet light emitting devices integrated on Si comprise a group III-Nitride based nanostructure that when biased to 10V emits spectrally narrow light at 318 nm. The devices are amenable for use in applications such as providing ultraviolet (UV) light for curing of epoxy, water disinfection and spectroscopic applications utilizing narrowband light. Advantages of the disclosed devices include multiple order of magnitude reduction in operating bias as compared with known devices operating in this wavelength range, and scalability provided by the use of Si-based fabrication processes.

Illustrative devices disclosed herein comprise atomically sharp 318 nm Gd:AlGaN ultraviolet light emitting diodes on Si with low threshold voltage.

Epitaxial integration of rare earth pnictides (RE-Pn), such as ErAs and ErSb, in group III-arsenide (III-As) semiconductors has attracted attention for applications in novel high speed photodetectors and photoconductive switches as well as enhanced tunnel junctions. In other aspects disclosed herein, techniques are disclosed for integration of the RE-Pn GdN as discrete particles in a GaN matrix by plasma assisted molecular beam epitaxy. It is hypothesized that the growth of GdN particles proceeds in a similar fashion to that of RE-Pn in III-As zincblende systems, with growth proceeding by nucleation of RE-Pn islands followed by epitaxial lateral overgrowth of the surrounding uncovered III-V matrix. In performed experiments, periodic structures of GdN nano-island layers spaced between GaN regions were prepared and subsequently characterized by a variety of methods. High resolution X-ray diffractometry shows that the cubic, rocksalt structure, GdN islands are epitaxially oriented to the hexagonal wurtzite GaN matrix with the relationship GdN [111]||GaN[0001]. The XRD result also indicates the precise layer thickness control due to the presence of superlattice interference fringes. Cross-sectional scanning transmission electron microscopy (STEM) combined with in-situ reflection high-energy electron diffraction (RHEED) allows for the study of island formation dynamics, which occurs after 1.2 monolayers of GdN coverage. Superconducting quantum interference device (SQUID) magnetometry reveals multiple ferromagnetic phases, with one attributable to the GdN particles with Curie temperature of 70K and an anomalous phase with ferromagnetism persistent to room temperature as well as a paramagnetic background, which is proposed to be due to contamination of the GaN matrix with Gd during growth. The room temperature ferromagnetic phase is strongly anisotropic, with out of plane magnetization nearly 300% larger than in-plane at fields less than 1 T. In addition, electroluminescent devices were fabricated by embedding GdN nanoparticles in an aluminum nitride matrix. At low device biases of 15V, clear, narrow emission at 318 nm is observed, corresponding to impact excitation of $Gd^{3+}$ intra-f-shell atomic transitions.

With reference to FIG. 1, a gadolinium (Gd) doped aluminum gallium nitride (AlGaN) ultraviolet (UV) light emitting diode (LED) includes a silicon substrate 10 on which self-assembled group III-nitride (and more particularly $Al_xGa_{1-x}N$) heterostructures, e.g. nanowires 12, are grown by plasma-assisted molecular beam epitaxy (MBE). Alternatively, another nitride heteroepitaxy technique such as metalorganic chemical vapor deposition (MOCVD) may be employed to form the nanowires 12. The illustrative nanowires 12 are polarization-induced nanowire diode (PINLED) elements. Details on the growth of polarization-induced nanowire diodes is set forth, for example, in Meyers et al., U.S. Pub. No. 2013/0207075 A1 published Aug. 15, 2013, which is incorporated herein by reference in its entirety. In general, nanowire growth on a gallium (Ga) face in which the nanowire has a wurtzite structure and is compositionally graded along its length from gallium-rich $Al_xGa_{1-x}N$ to aluminum-rich $Al_xGa_{1-x}N$ produces n-type polarization doping; while, nanowire growth on a Ga face in which the wire is compositionally graded along its length from aluminum-rich $Al_xGa_{1-x}N$ to gallium-rich $Al_xGa_{1-x}N$ produces p-type polarization doping. The polarities are reversed for compositionally graded nanowire growth on a nitrogen (N) face. Thus, growth on a Ga face of nanowires with wurtzite structure that are compositionally graded from gallium-rich $Al_xGa_{1-x}N$ to aluminum-rich $Al_xGa_{1-x}N$ and then back from aluminum-rich $Al_xGa_{1-x}N$ to gallium-rich $Al_xGa_{1-x}N$ generates a nanowire diode by polarization doping. In the devices disclosed herein, a gadolinium-doped active region is sandwiched between the two compositionally graded regions, with the aluminum-rich $Al_xGa_{1-x}N$ ends of the regions adjoining the active region. From these heterostructures, electrical devices are fashioned by depositing semitransparent 10 nm/20 nm Ni/Au contacts 14 with an electron beam evaporator for the top contact, which connect the vertical ensemble in parallel. A back contact 16 is fashioned by mechanically removing the nanowires adjacent to the top contact with a diamond scribe and thermally diffusing In metal directly to the n-Si with a soldering ion.

Figure 2:
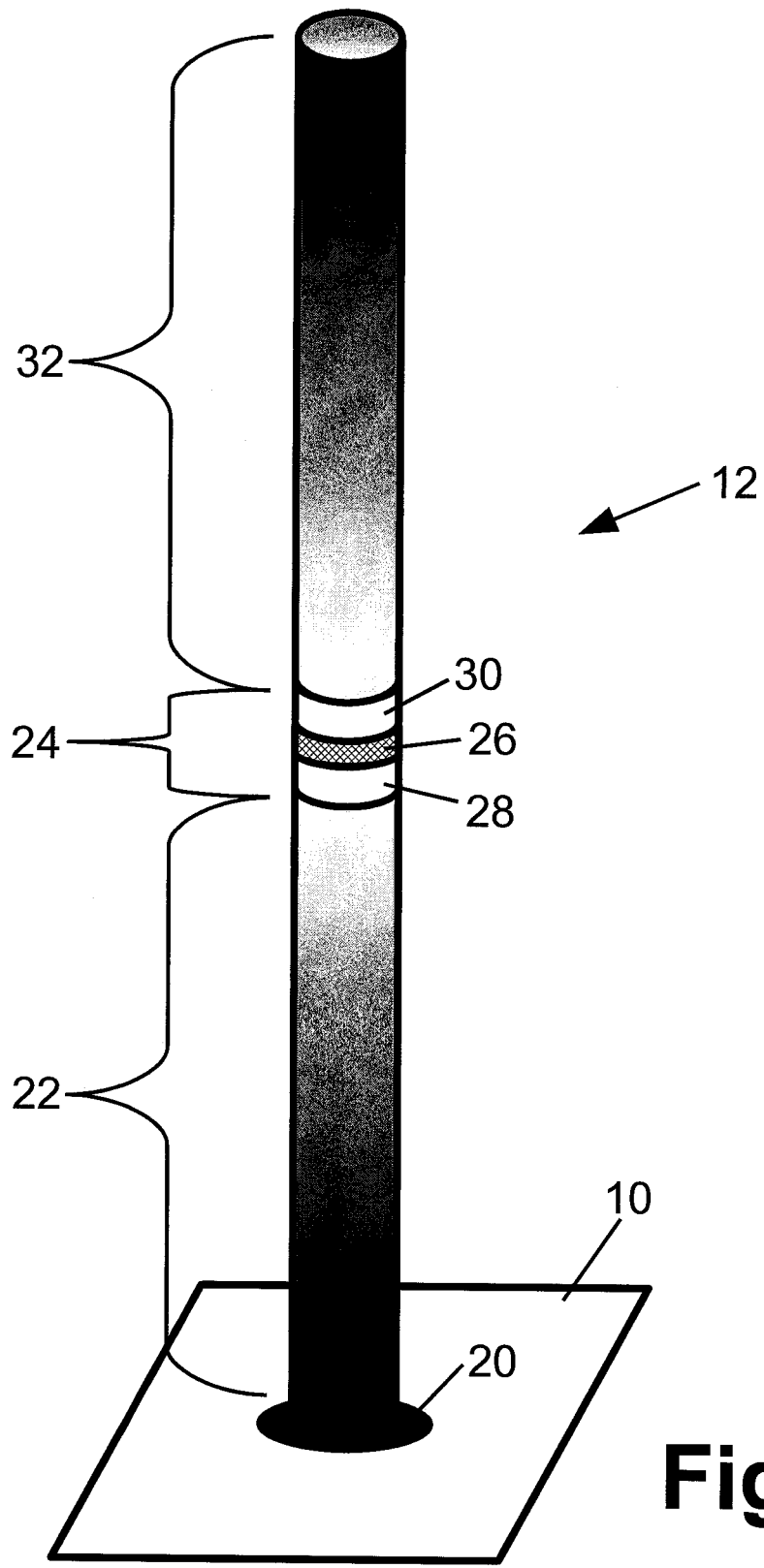
FIG. 2 diagrammatically shows one illustrative nanowire of the Gd-doped AlGaN UV LED of FIG. 1.

With continuing reference to FIG. 1 and with further reference to FIG. 2, which diagrammatically shows one illustrative nanowire 12, the illustrative nanowires 12 contain Gd doping in their active region, and are prepared by plasma-assisted molecular beam epitaxy on n-Si(111). The nanowire 12 comprises a GaN nucleation layer 20 deposited on the silicon substrate 10 followed by a linear grade in composition from GaN to AlN over 100 nm to form a first region 22. This is followed by deposition of an active region 24 comprising, in the illustrative example, 2.4 monolayers (ML) of gadolinium nitride (GdN) 26 deposited between two 5 nm unintentionally doped (uid)-AlN spacer layers 28, 30. Alternatively, the GdN layer can be replaced by a high Gd-content $Al_{1-y}Gd_yN$ layer, e.g. with y≥0.5. Moreover, a configuration with two or more GdN (or AlGdN) layers sandwiched between AlN spacer layers is also contemplated. The structure is then linearly graded in composition from AlN back to GaN to form a second region 32.

Figure 3:
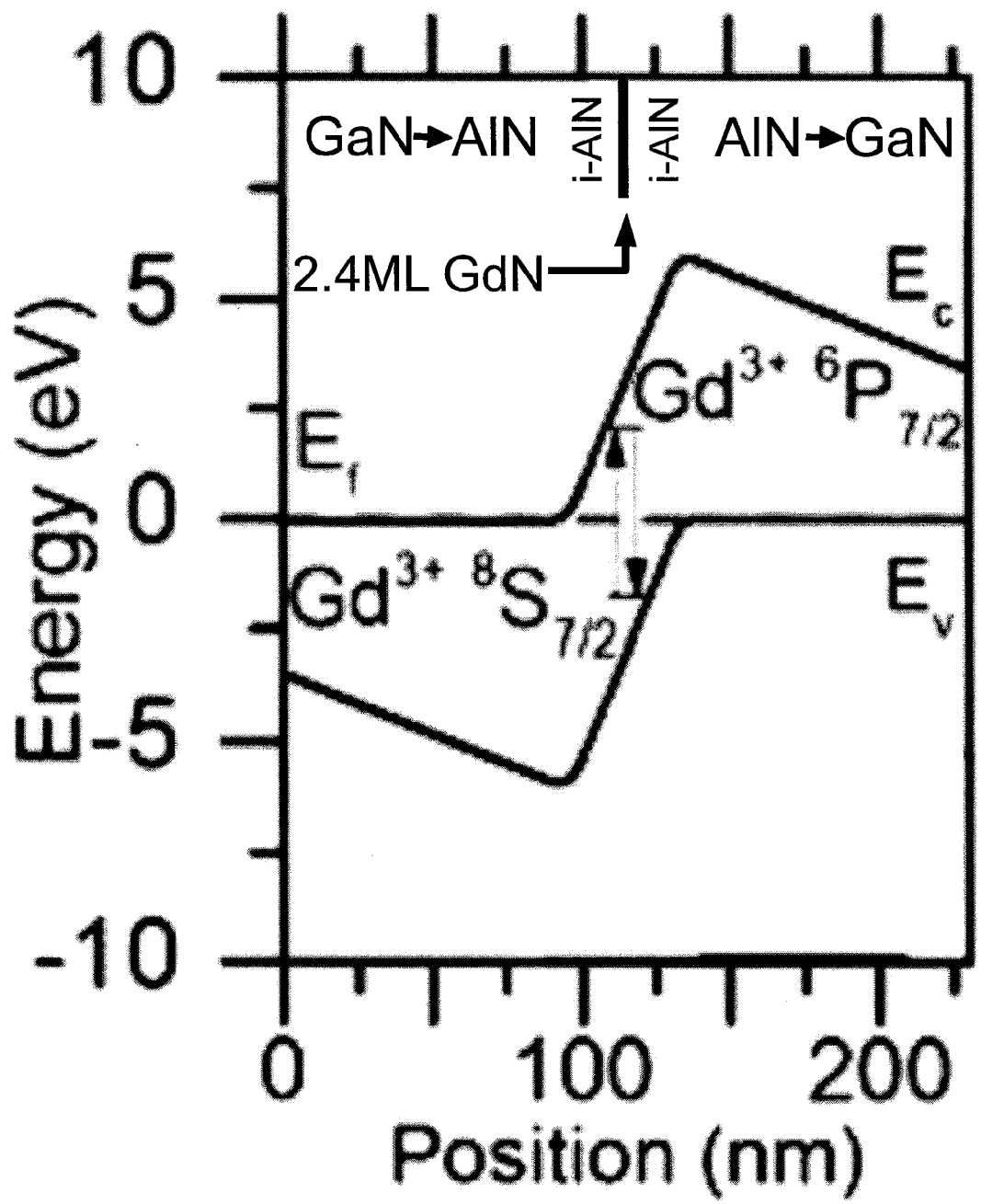
FIG. 3 plots a band diagram of the nanowire of FIG. 2 calculated with a self-consistent Schrödinger-Poisson solver.

With continuing reference to FIG. 2 and with further reference to FIG. 3, this structure forms a pn-diode, the band diagram of which is shown in FIG. 3 and was calculated with a self-consistent Schrödinger-Poisson solver. The spontaneous polarization present in wurtzite $Al_xGa_{1-x}N$ combined with a gradient in composition give rise to polarization-induced hole and electron doping, respectively, as described for example in Meyers et al., U.S. Pub. No. 2013/0207075 A1. In addition to the built in polarization doping, the nanowires 12 are optionally supplementary doped with Mg and Si in p and n regions, assuming c-axis, Ga-polar orientation of the nanowires.

Figure 4:
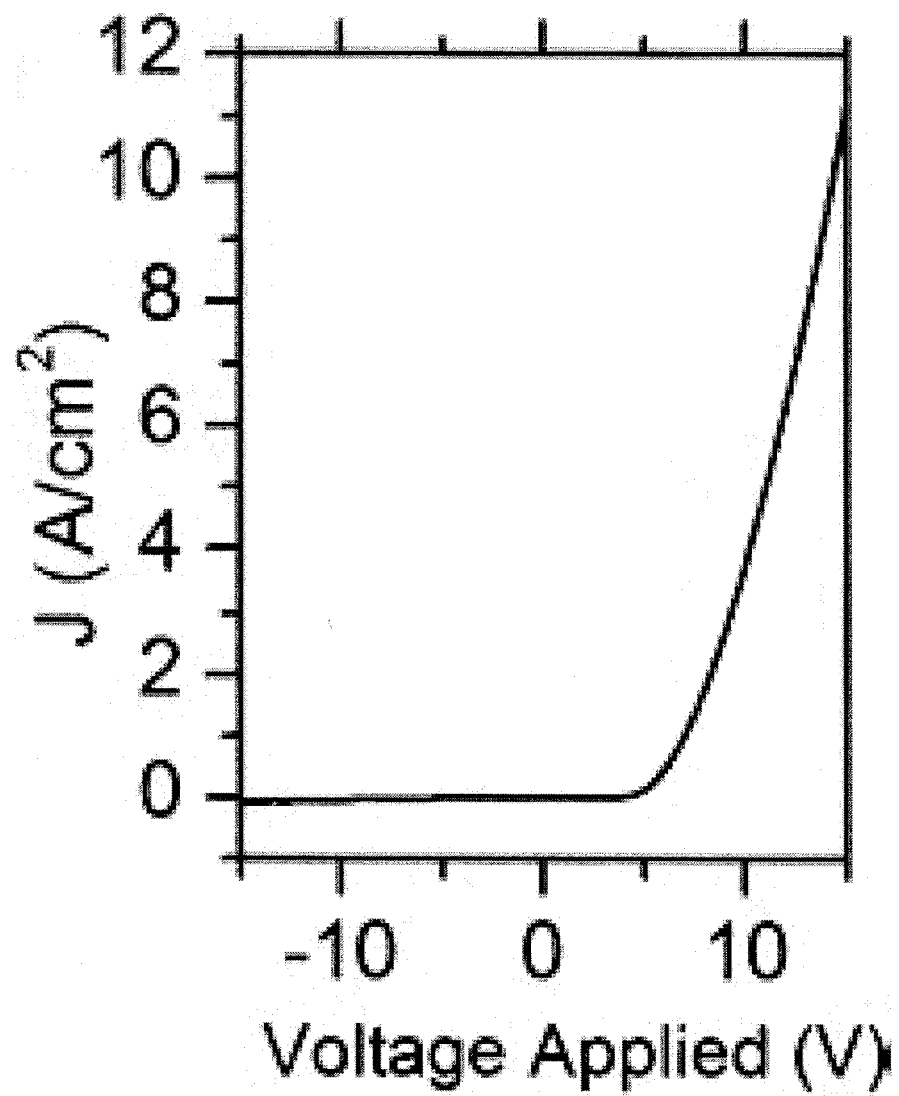
FIG. 4-7 present experimental results for Gd-doped AlGaN UV LEDs as described herein.
Figure 5:
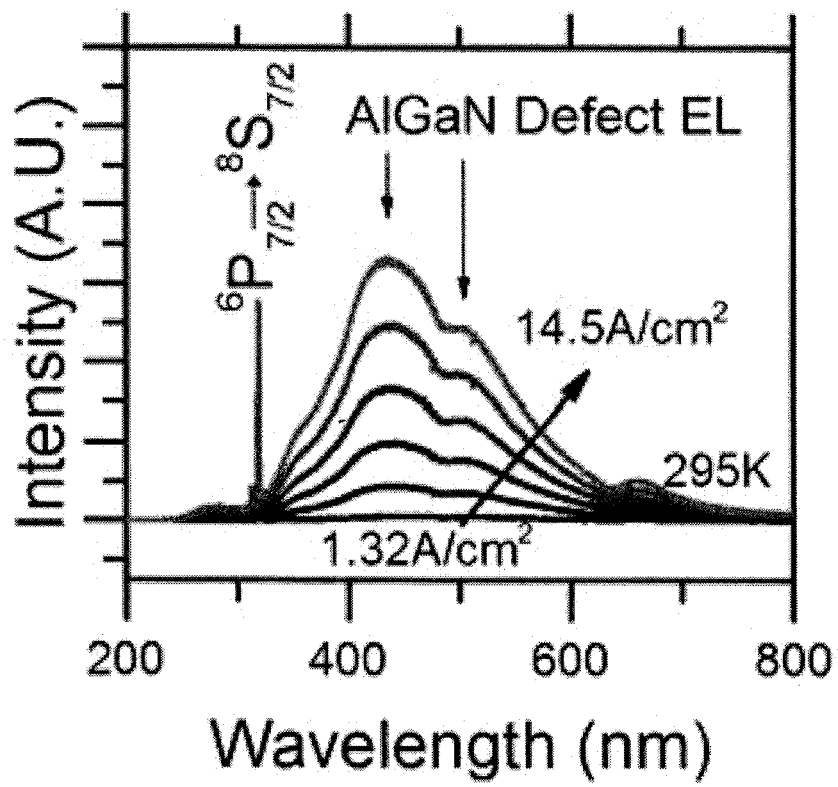
Figure 6:
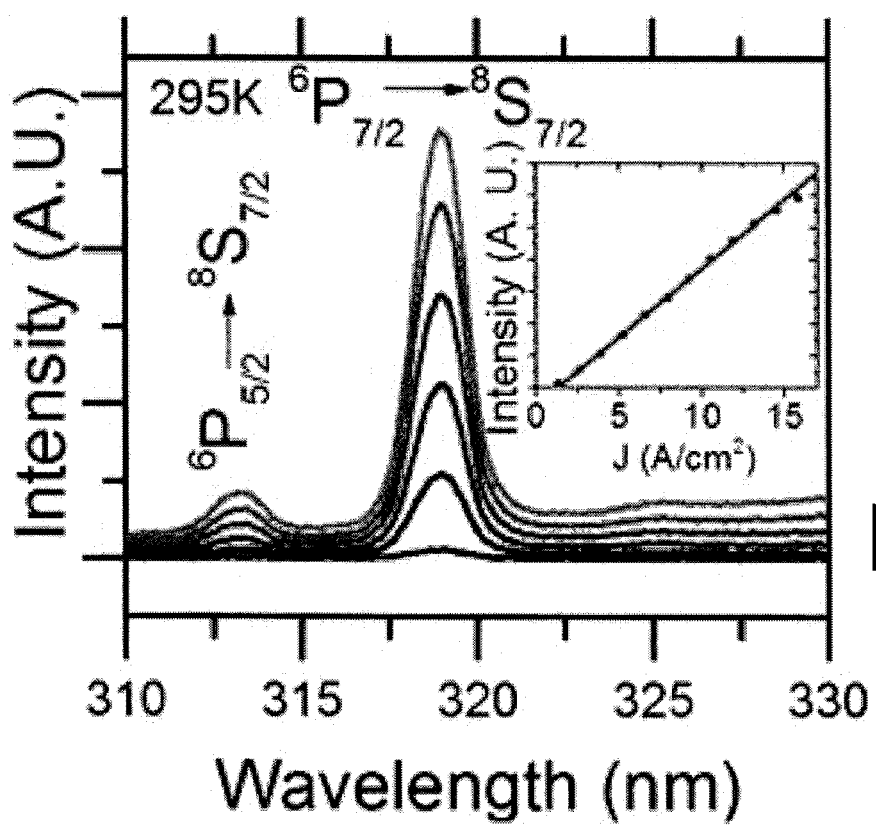

With reference now to FIGS. 4-6, some experimental results for characterization of actually fabricated Gd-doped AlGaN UV LED devices are presented.

FIG. 4 shows Current-Voltage (IV) behavior of the devices measured with a probe station and an Agilent B1500 semiconductor parameter analyzer. Device IV curves show rectifying behavior with device turn on at 5 V.

Spectroscopic measurements were performed using a variable temperature ultraviolet/visible/near infrared (UV-VIS-NIR) spectroscopy system comprising a closed cycle ARS DMX20-OM cryostat and a Princeton instruments SP2500i 0.5 m spectrometer equipped with a Princeton instruments PIXIS100 UV-VIS-NIR CCD. For electroluminescence (EL) measurements, devices were connected to a Yokogawa DC constant current source and Keithley 2700 data acquisition system. Prior to the collection of any spectra, a background spectrum was collected with no current injection in the device. Constant currents were tested in a range of 10 mA to 120 mA, corresponding to device current densities from 1.32 $A/cm^2$ to 14.5 $A/cm^2$. Note that the current density through any given nanowire is unknown, and in general not all individual nanowires give EL. The EL light was collected through a 50 mm, f/2 ultraviolet-fused silica singlet lens, collimated and subsequently focused onto the entrance slit of the 0.5 m spectrometer.

FIG. 5 shows room temperature (295 K) electroluminescence (EL) spectra for several electric current densities in the range 1.32 $A/cm^2$ to 14.5 $A/cm^2$. The EL spectra exhibit multiple emission peaks from the UV through the visible parts of the spectrum, including a sharp peak at 318 nm.

The sharp peak at 318 nm is shown enlarged in FIG. 6, and corresponds to the $^6P_{7/2} \rightarrow {}^8S_{7/2}$ first excited state to ground state transition of the $Gd^{3+}$ ion. Also seen in the enlarged view of FIG. 6 is an additional peak at the correct energy for the $^6P_{5/2} \rightarrow {}^8S_{7/2}$ second excited state to ground state transition. The intensity of these peaks scale linearly with current density, within the range of currents investigated, as seen in the inset of FIG. 6. The Gd emission exhibits a full-width-at-half-maximum (FWHM) of 23.1 meV. Additional broad EL peaks in the 400 nm-700 nm range are attributed to below band gap defects in AlGaN, due to observation of identical emission spectra in non-Gd containing devices, though the graded structure of the nanowires 12 makes precise identification of the deep levels difficult.

With brief reference back to FIG. 1, the extraneous emissions in the 400-700 nm range are optionally removed by a suitable wavelength-selective optical filter 40 that passes the Gd emission of interest, e.g. having a passband at 318 nm with FWHM of slightly larger than 23 meV, so that light emitted by the nanowires 12 and passing through the filter 40 consists of the 318 nm line with FWHM of 23.1 meV.

Figure 7:
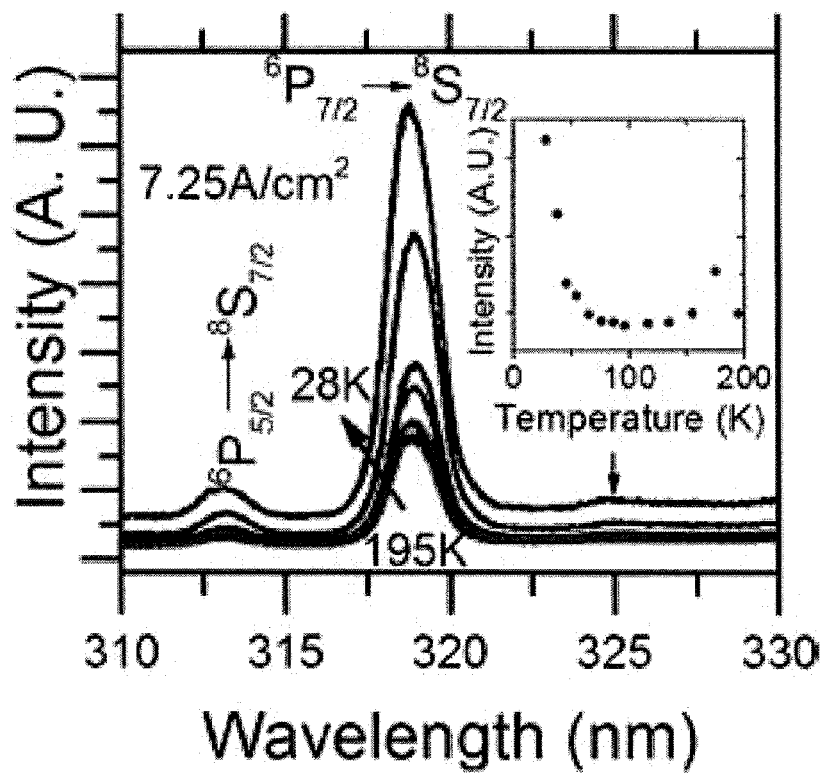

With reference to FIG. 7, to further investigate the mechanism by which the UV emission occurs, variable temperature EL measurements were conducted from room temperature to 30K, and the results are plotted in FIG. 7. Spectral intensity of the main $^6P_{7/2} \rightarrow {}^8S_{7/2}$ Gd 4f peak is observed to be invariant at temperatures above 75 K, below which the intensity increases dramatically, as seen in the inset of FIG. 7. Similar behavior has been previously observed in Eu-doped GaN (Nyein et al., Appl. Phys. Lett. 82, 1655 (2003)) and in Er-doped InGaP (Neuhalfen et al., Appl. Phys. Lett. 60, 2657 (1992)) and has been attributed to thermal quenching of the multi-step excitation mechanism of the $RE^{3+}$ ion. At low temperature another peak becomes distinct at 324 nm. This peak has been previously identified as a phonon replica of the primary 318 nm peak in cathodoluminescence experiments. Vetter et al., Appl. Phys. Lett. 83, 2145 (2003). From analysis of the peak positions, a phonon mode energy of 72.2 meV is measured, which is smaller than the 110 meV LO phonon energy of the surrounding AlN matrix (Bergman et al., J. Appl. Phys. 85, 3535 (1999)) and the 92 meV LO phonon energy of GaN (Cingolani et al., Solid State Commun. 58, 823 (1986)). The observed phonon energy of 72.2 meV agrees within the resolution of the spectrometer with results from cathodoluminescence experiments reported in Vetter, supra.

Figure 8:
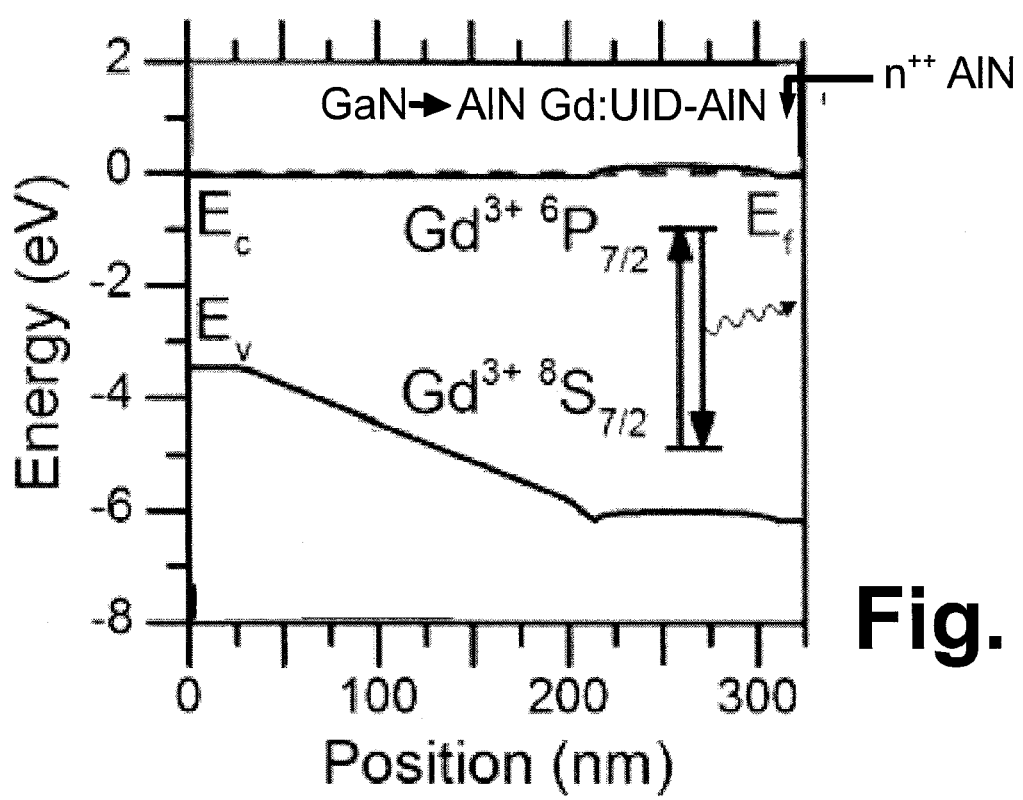
FIG. 8 plots a band diagram of the nanowire-based unipolar metal-insulator-semiconductor (MIS) heterostructure with Gd doping as described herein, calculated with a self-consistent Schrödinger-Poisson solver.

With reference to FIG. 8, many RE electroluminescent devices rely on the impact excitation mechanism to drive intra-f-shell EL. In the interest of investigating EL under these conditions in nanowire based devices, a structure was prepared consisting of an n-type nanowire graded from GaN to AlN, with a 200 nm uid-AlN layer doped with Gd ions ($1 \times 10^{18}$ $cm^{-3}$) and capped with a small amount of $n^{++}$ AlN for a top contact. Growth conditions for this unipolar metal-insulator-semiconductor (MIS) heterostructure are identical to the n-region and depletion region of the polarization-induced nanowire diode (PINLED) device described with reference to FIGS. 1 and 2, thus similar defect content is expected in both structures. An identical device contact scheme to that of the heterojunction diode of FIGS. 1 and 2 is used. FIG. 8 illustrates the calculated bandstructure.

Figure 9:
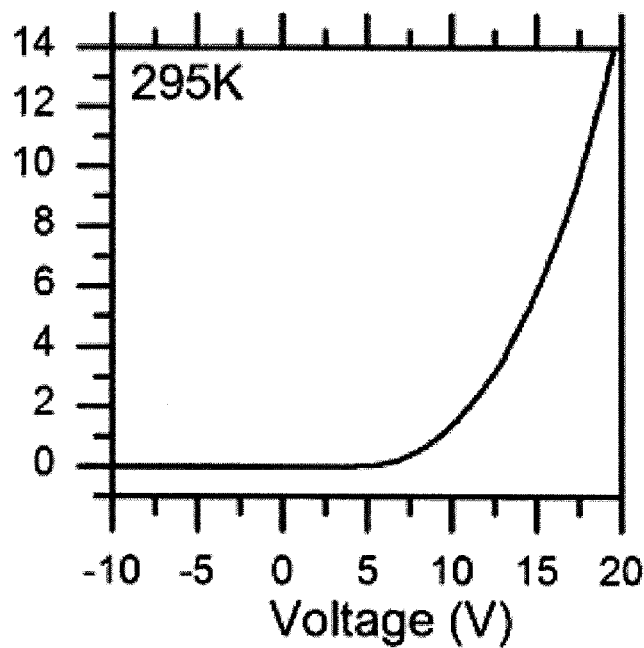
FIGS. 9 and 10 present experimental results for nanowire-based unipolar MIS heterostructures with Gd doping as described herein.

With reference to FIG. 9, the unipolar Gd:AlGaN MIS heterostructure is rectifying—but it is less conductive than the PINLED device of FIGS. 1 and 2, producing 5.9 $A/cm^2$ compared to 11.2 $A/cm^2$ when forward biased to 15 V. For the applied bias at 15 V, it is calculated that the active region of the MIS device develops an electric field in excess of 0.75 MV/cm, whereas the PINLED should have approximately flat band conditions in the active region, due to reduction of band bending in forward bias. The lower conductivity of the MIS devices can be attributed to the uid-AlN center region as well as a large Schottky barrier between the n++ AlN and the Ti/Au top contact which produce additional series resistance in the device over the PINLED.

Figure 10:
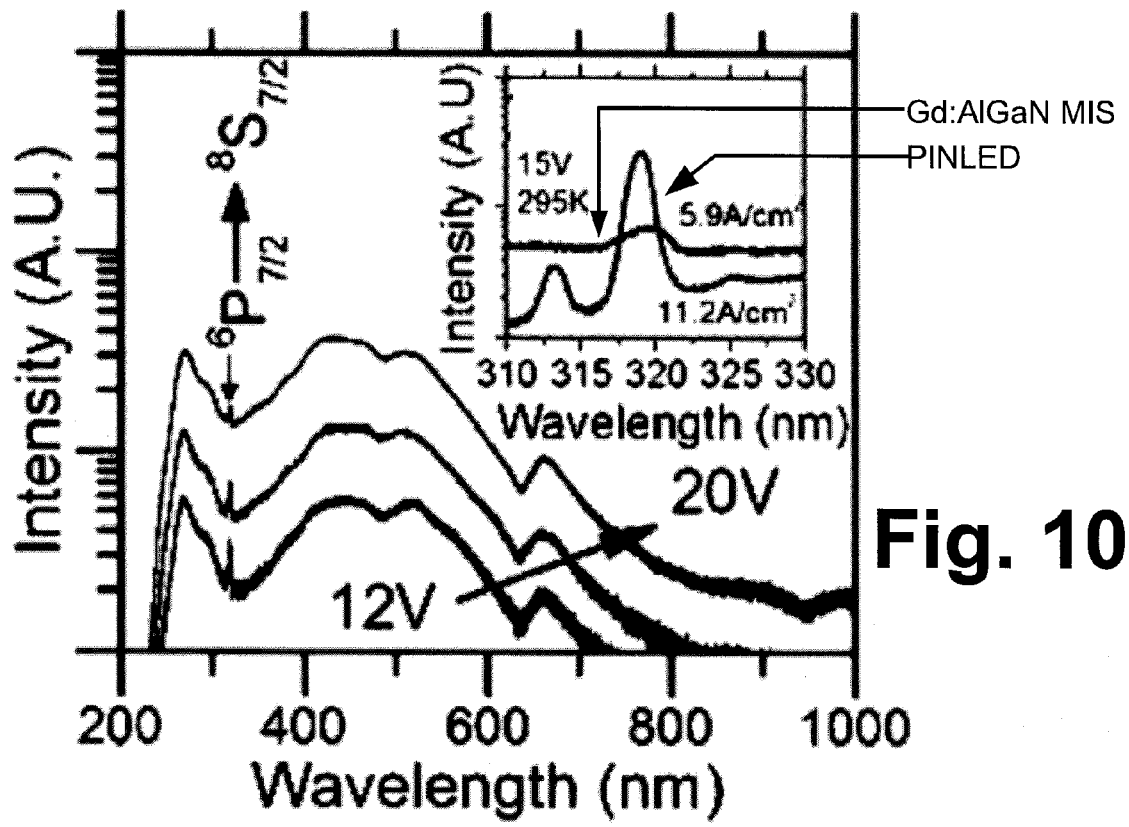

With reference to FIG. 10, electroluminescence spectroscopy data are shown for the unipolar Gd:AlGaN MIS device. The EL spectra of FIG. 10 show a weak, but detectable, peak at 318 nm among a large background of defect luminescence, indicating that some Gd ions are being excited by hot electrons passing through the structure as well as impact excitation of band to defect luminescence. The inset of FIG. 10 shows a comparison of emission from PINLED devices and Gd:AlGaN MIS structures. This comparison shows a 372% enhancement of intensity of the $^6P_{7/2} \rightarrow {^8S_{7/2}}$ transition in the PINLED devices over the Gd:AlGaN MIS devices at 15V bias. Additionally, no peak corresponding to the $^6P_{5/2} \rightarrow {^8S_{7/2}}$ higher order transition is present in the emission spectra from the unipolar Gd:AlGaN MIS structure. It is noted that due to the variety of possible mechanisms for RE 4f excitation in III-V materials, the difference in performance between the MIS device and the PINLED device could be affected by phenomena which are extrinsic to the E-field regime, such as preferential interaction of one carrier type with the RE ion.

The actually fabricated devices described herein have employed Gd doping. However, it is contemplated to substitute another 4f phosphor rare earth dopant for Gd to achieve a spectrally stable electrically driven emission at a different wavelength.

It will be appreciated that various of the above-disclosed and other features and functions, or alternatives thereof, may be desirably combined into many other different systems or applications. It will be further appreciated that various presently unforeseen or unanticipated alternatives, modifications, variations or improvements therein may be subsequently made by those skilled in the art which are also intended to be encompassed by the following claims.

The invention claimed is:

1. An apparatus comprising:
a diode comprising nanowires that are compositionally graded along their lengths and that include an active region sandwiched between first and second compositionally graded $Al_xGa_{1-x}N$ nanowire regions wherein:
the active region is doped with gadolinium,
the first compositionally graded $Al_xGa_{1-x}N$ nanowire region is compositionally graded from gallium-rich $Al_xGa_{1-x}N$ to aluminum-rich $Al_xGa_{1-x}N$ with the compositional grading defining n-type polarization doping and with the aluminum-rich $Al_xGa_{1-x}N$ end proximate to the active region, and
the second compositionally graded $Al_xGa_{1-x}N$ nanowire region is compositionally graded from aluminum-rich $Al_xGa_{1-x}N$ to gallium-rich $Al_xGa_{1-x}N$ with the compositional grading defining p-type polarization doping and with the aluminum-rich $Al_xGa_{1-x}N$ end proximate to the active region.

2. The apparatus of claim 1 wherein:
the first compositionally graded $Al_xGa_{1-x}N$ nanowire region is compositionally graded from GaN to AlN with the AlN end proximate to the active region;
the second compositionally graded $Al_xGa_{1-x}N$ nanowire region is compositionally graded from AlN to GaN with the AlN end proximate to the active region; and
the active region comprises AlN and gadolinium.

3. The apparatus of claim 1 further comprising:
a substrate having a GaN surface on which the first compositionally graded $Al_xGa_{1-x}N$ nanowire region is disposed with its gallium-rich $Al_xGa_{1-x}N$ end proximate to the GaN surface; and
a semitransparent electrical contact disposed on the gallium-rich $Al_xGa_{1-x}N$ end of the second compositionally graded $Al_xGa_{1-x}N$ nanowire region.

4. The apparatus of claim 3 wherein the substrate comprises a silicon substrate with a GaN nucleation layer disposed on the silicon substrate.

5. The apparatus of claim 1 wherein the active region comprises AlN and gadolinium.

6. The apparatus of claim 5 wherein the active region comprises one or more GdN layers sandwiched between AlN layers.

7. The apparatus of claim 5 wherein the active region comprises an $Al_{1-y}Gd_yN$ layer with $y \geq 0.5$.

8. An apparatus comprising:
a polarization-induced nanowire diode comprising aluminum gallium nitride doped with gadolinium;
wherein the polarization-induced nanowire diode comprises a stack including a first region graded from gallium nitride to aluminum nitride, an active region doped with gadolinium, and a second region graded from aluminum nitride to gallium nitride.

9. The apparatus of claim 8 wherein the active region doped with gadolinium comprises an aluminum nitride layer doped with gadolinium.

10. The apparatus of claim 8 wherein the first region graded from gallium nitride to aluminum nitride further includes doping of a first type and the second region graded from aluminum nitride to gallium nitride further includes doping of a second type opposite the first type.

11. The apparatus of claim 8 further comprising a wavelength-selective optical filter arranged to pass a gadolinium emission of interest generated by electroluminescence of the nanowire diode while blocking other electroluminescence spectral components of the nanowire diode.

12. The apparatus of claim 8 further comprising a silicon substrate on which the nanowire diode is disposed.

13. The apparatus of claim 8 further comprising electrodes arranged to electrically energize the nanowire diode.

14. The apparatus of claim 8 wherein the active region doped with gadolinium comprises a gadolinium nitride (GdN) layer disposed between aluminum nitride spacer layers.

15. The apparatus of claim 14 wherein the GdN layer is 10 monolayers thick or less.

16. The apparatus of claim 14 wherein the GdN layer is 5 monolayers thick or less.

17. An apparatus comprising:
a diode comprising aluminum gallium nitride and including an active region comprising a $Al_{1-y}Gd_yN$ layer with $y \geq 0.5$ disposed between aluminum nitride spacer layers.

18. The apparatus of claim 17 wherein the $Al_{1-y}Gd_yN$ layer comprises a gadolinium nitride (GdN) layer.

19. The apparatus of claim 18 wherein the diode further comprises a first region graded from gallium nitride to aluminum nitride and a second region graded from aluminum nitride to gallium nitride, wherein the active region is sandwiched between the first and second regions with the aluminum nitride of each of the first and second regions proximate to the active region.

* * * * *